United States Patent [19]

Haque et al.

[11] Patent Number: 4,588,641
[45] Date of Patent: May 13, 1986

[54] THREE-STEP PLASMA TREATMENT OF COPPER FOILS TO ENHANCE THEIR LAMINATE ADHESION

[75] Inventors: Reza Haque, Hamden; Edward F. Smith, III, Madison, both of Conn.

[73] Assignee: Olin Corporation, New Haven, Conn.

[21] Appl. No.: 707,929

[22] Filed: Mar. 4, 1985

Related U.S. Application Data

[62] Division of Ser. No. 554,466, Nov. 22, 1983, Pat. No. 4,524,089.

[51] Int. Cl.$^4$ .................. B05D 3/06; B05D 5/10
[52] U.S. Cl. .................. 428/413; 428/457; 428/462; 428/473.5; 427/41; 156/272.6
[58] Field of Search .............. 427/41; 428/457, 413, 428/462, 473.5; 156/272.6

[56] References Cited

U.S. PATENT DOCUMENTS

| | | | |
|---|---|---|---|
| 3,518,108 | 6/1970 | Heiss, Jr. et al. | 427/41 |
| 3,703,585 | 11/1972 | Agnone et al. | 204/298 |
| 3,940,506 | 2/1976 | Heinecke | 427/38 |
| 4,013,532 | 3/1977 | Cormia et al. | 427/39 |
| 4,036,136 | 7/1977 | Takagi | 420/40 |
| 4,131,691 | 12/1978 | Morley et al. | 427/41 |
| 4,166,784 | 9/1979 | Chapin et al. | 427/39 |
| 4,170,662 | 10/1979 | Weiss et al. | 427/38 |
| 4,226,896 | 10/1980 | Coburn et al. | 427/34 |
| 4,260,647 | 4/1981 | Wang et al. | 427/40 |
| 4,264,642 | 4/1981 | Ferralli | 427/38 |
| 4,374,694 | 2/1983 | Blenner et al. | 156/272.6 |
| 4,396,450 | 8/1983 | Blenner et al. | 156/272.6 |
| 4,407,852 | 10/1983 | Sapieha et al. | 427/41 |

OTHER PUBLICATIONS

Shen et al., "A Review of Recent Advances in Plasma Polymerization", *Plasma Polymerization*, American Chemical Society, 1979, pp. 1–33.
Kominiak et al., Thin Solid Films 40, 141 (1977).

*Primary Examiner*—Richard Bueker
*Attorney, Agent, or Firm*—Barry L. Kelmachter; Howard M. Cohn; Paul Weinstein

[57] ABSTRACT

A three-step plasma treatment for improving the laminate adhesion of metallic and non-metallic substrates is described. The treatment comprises sequentially exposing the substrate to a first plasma of oxygen gas, a second plasma of a hydrocarbon monomer gas and a third plasma of oxygen gas. The process has particular utility in forming polymeric films on one or more surfaces of copper or copper alloy foils to be used in printed circuit applications.

10 Claims, 2 Drawing Figures

THREE-STEP PLASMA TREATMENT OF COPPER FOILS TO ENHANCE THEIR LAMINATE ADHESION

This application is a division, of application Ser. No. 554,466, filed Nov. 22, 1983, now U.S. Pat. No. 4,524,089.

This application is related to co-pending U.S. patent application Ser. No. 554,465, filed on Nov. 22, 1983, to Haque et al. for a ONE-STEP PLASMA TREATMENT OF COPPER FOILS TO INCREASE THEIR LAMINATE ADHESION, now U.S. Pat. No. 4,526,806.

This application is directed to the production of treated copper foil for use in electronic devices.

Printed circuit boards are currently used as the substrate materials in a wide variety of electronic devices. Typically, these boards are fabricated from a thin sheet of copper foil laminated to either a fiberglass/epoxy hardboard or, in some cases, flexible plastic substrates. During the latter stages of fabrication, the majority of the copper foil is etched away to provide the desired interconnecting circuitry between various components in an electronics circuit design. With improvements in etching technology, it is currently possible to achieve intercircuit line spacing approaching 3 to 5 mils. Minimum line spacing is one of the current technical limitations to continued miniaturization of complex circuits. As the minimum line spacing is reduced, a higher density component packing is permitted on a circuit board. Attempts to further reduce the minimum line spacing have become limited by the physical characteristics of the copper foil.

Generally, copper foil is produced by either electrodeposition or a rolling technique. In both cases, the resultant surface of the foil is not readily amenable to producing adequate bond strength after lamination. As a result, all foil must be treated by an additional electrochemical process to improve its bondability. The most common electrolytic techniques currently used to improve the adhesion of copper foils are directed to the production of dendritic surfaces on the copper foil. The dendritic surfaces improve adhesion by contributing to mechanical interlocking between the copper foil and the substrate. However, the dendritic or roughened surfaces can for specific applications unfavorably affect the performance characteristics of the foil. For example, line spacing in the selective etching of copper foils could be adversely affected. Further, the degree of attenuation and the speed of transmission of high frequency signals could also be adversely affected. In view of this, a treatment that yields a copper foil with improved adhesion without increasing the overall surface roughness is most desirable.

Some interest in using substrates having polymer film coatings for printed circuit applications has been expressed in the prior art. Polymer coatings are particularly advantageous because they can serve as capacitor dielectrics, insulators, and/or protective layers. A variety of different approaches including sputtering and ion implantation have been tried in an attempt to coat various metallic and non-metallic substrate materials with polymer films. U.S. Pat. Nos. 3,703,585 to Agnone et al. and 4,264,642 to Ferra illustrate some of these different approaches.

The technique for forming polymer films that has drawn the most attention is the glow discharge plasma technique. It has been found that polymer films formed using this technique have unique physical properties and are relatively thin and substantially pinhole-free. Most glow discharge plasma treatment techniques consist of placing a substrate to be coated in a plasma in a surrounding chamber and injecting a particular gas such as a monomer into the chamber. The type of gas injected into the chamber normally depends upon the type of polymer coating to be deposited on the substrate. U.S. Pat. Nos. 3,518,108 to Heiss, Jr. et al., 4,013,532 to Cormia et al., 4,133,691 to Morley et al., 4,166,784 to Chapin et al., 4,170,662 to Weiss et al. and 4,226,896 to Coburn et al. and the article "A Review of Recent Advances in Plasma Polymerization" by Mitchel Shen et al., *Plasma Polymerization*, American Chemical Society, 1979 illustrate some of the plasma polymerization treatments that have been used in the prior art.

While most glow discharge treatments inject a single gas into the chamber in which the plasma is formed, it is also known to deposit a polymer coating on a substrate by placing the substrate in a plasma containing a mixture of gases. In U.S. Pat. No. 3,940,506 to Heinecke, a process is described for selectively treating a surface of an article comprising silicon in part and either silica or silicon nitride in part by placing the article in a plasma containing fluorine, carbon and a reducing species such as trifluoromethane to deposit a fluoropolymer coating on the article.

In yet another glow discharge plasma treatment process, an amorphous continuous layer of $SiO_x$ is deposited onto a substrate in a series of thin layers by glow discharge of an organosilane and oxygen, interrupting the deposition as required, and initiating a glow discharge in oxygen after each interruption and prior to each subsequent deposition. U.S. Pat. No. 4,260,647 to Wang et al. illustrates this type of approach.

In accordance with the present invention, a three-step plasma treatment for depositing a polymer coating on a substrate material to enhance its laminate adhesion is provided. The treatment comprises sequentially exposing a substrate material to be coated to a plasma of oxygen, a plasma of hydrocarbon monomer, and a second plasma of oxygen. While the process of the present invention has wide applicability, it has been found to have particular utility in depositing relatively smooth polymeric films on copper and copper alloy foils.

The process of the present invention is preferably performed by inserting the substrate material to be coated into a chamber containing two electrodes. The chamber is first evacuated to a desired base pressure. After evacuation to the base pressure has been completed, oxygen in gaseous form is introduced into the chamber at a desired flow rate and the system is adjusted to a desired working pressure. A suitable current at a desired frequency and a desired power level are applied to the electrodes to create a plasma of oxygen. After the substrate has been exposed to the plasma for a desired time, the power is turned off, the gas flow is shut off, and the chamber is evacuated back to the base pressure. After the chamber has stabilized at the base pressure, a second gas such as a hydrocarbon monomer is introduced into the chamber at a desired flow rate and the system is adjusted to the desired working pressure. A plasma with the second gas is then created by applying current and power to the electrodes. Again, after the substrate has been exposed to the second plasma for a desired period of time, the power is turned off, the second gas flow is shut off, and the chamber is evacuated back to the base pressure. Thereafter, the substrate undergoes a third step wherein oxygen is again introduced into the chamber at a desired flow rate and the system is again adjusted to a desired working pressure and a plasma is created.

It is believed that during the first step or oxygen pretreatment, the substrate material is primarily being cleaned. For example, where the substrate material comprises a copper foil, residual hydrocarbons, greasy materials and/or other contaminants are believed to be removed from the surface on which the coating is to be deposited. There may also be during this step some oxide formation on the surface of the substrate. The second step deposits the polymer film onto the substrate surface. It is believed that during the third step or oxygen post-treatment some of the bonds in the series forming the polymer film react with the oxygen to provide polar bonding sites for improved adhesion effect.

The process of the present invention may be performed in a single chamber in a batchwise manner or may be performed in a plurality of chambers in a continuous or semi-continuous manner. After the three-step treatment has been completed, the polymer coated substrate material may be laminated to another material. For example, the polymer coated substrate may be laminated to a fiberglass epoxy substrate in the case of printed circuit boards or to a polyimide in the case of flexible circuits.

It is an object of the present invention to provide a process for treating a substrate material to improve its bondability.

It is a further object of the present invention to provide a process as above for forming an adhesive polymeric coating on one or more surfaces of a substrate material.

It is still a further object of the present invention to provide a process as above for treating metal foil such as copper foil with a polymer coating to improve its laminate adhesion.

These and other objects will become apparent from the following description and drawings in which like reference numerals designate like elements.

Figure 1:
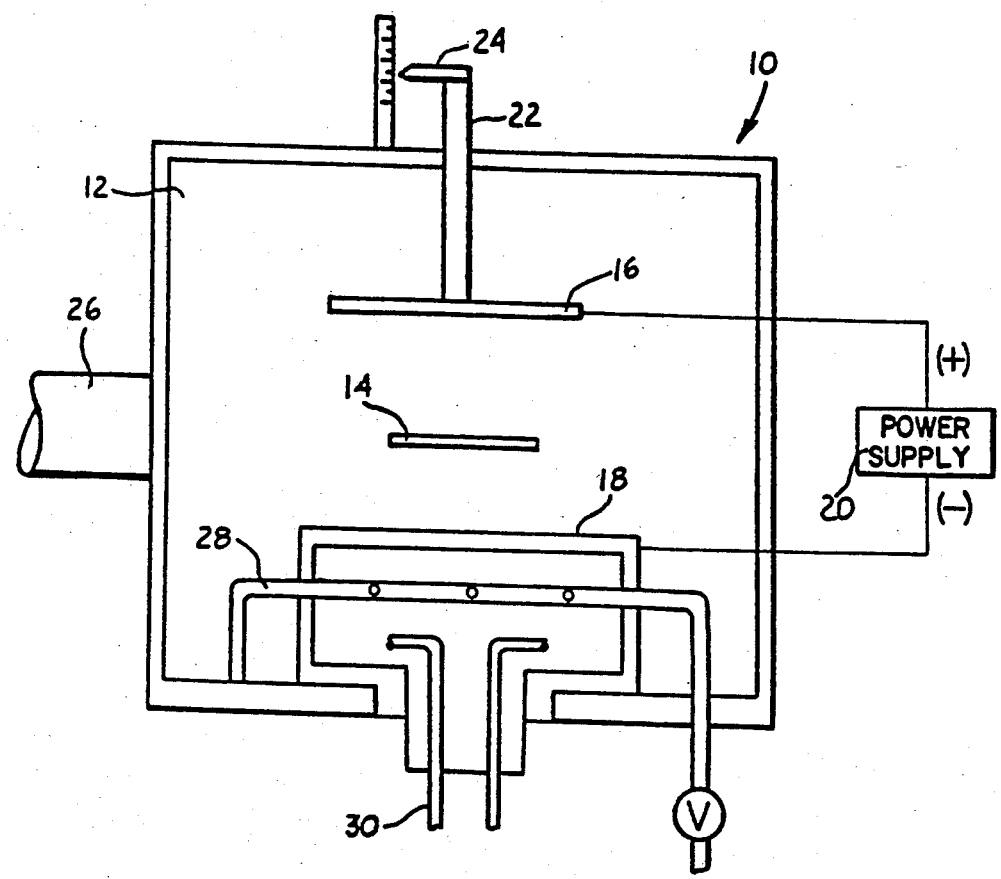
FIG. 1 is a schematic illustration of an apparatus that can be used to perform the process of the present invention.

In accordance with the present invention, a process for depositing a polymer film on at least one surface of a substrate material for improving the laminate adhesion of the substrate material is provided. While the following description describes the invention in the context of forming a polymer film on copper foil, the process of the present invention has wide applicability in treating other metal and metal alloy substrates as well as treating non-metallic substrates. Furthermore, while the invention will be described as a batch operation, it can be used as part of a continuous or semi-continuous operation.

Referring now to the Figures, the apparatus 10 includes a vacuum chamber 12 in which the polymerization of the substrate material 14 takes place. In the vacuum chamber are two electrodes 16 and 18, generally an anode 16 and a cathode 18. The electrodes 16 and 18 are both connected to an external power source 20 which may be either any conventional DC source or any conventional AC source known in the art. An AC source is preferred because films deposited from DC glow discharge systems are generally poor and difficult to reproduce. The electrodes 16 and 18 can be a screen, coil or plate formed from any suitable electrical conductor such as stainless steel, platinum or graphite. When an AC power source is used, the electrodes 16 and 18 may also be formed from dielectric materials.

In using an AC power supply, a current at a desired frequency and a desired power level is supplied to the electrodes. Both the frequency and the power level can be varied over a broad range as is well known to those skilled in the art.

If desired, the anode 16 may be adjustable. Suitable means 22 for adjusting the position of the anode relative to the cathode may be provided. There may also be an indicator 24 for displaying the separation between the anode and cathode. Generally, the electrodes 16 and 18 are spaced from about 2" to about 6" apart. In those situations where the frequency is other than a radio frequency, one or more magnets not shown may be mounted on the electrodes 16 and 18 to enhance the plasma.

The chamber 12 has an outlet 26 which permits evacuation of the interior of the chamber. The outlet 26 may be connected to any suitable conventional vacuum pump system (not shown) known in the art for evacuating the chamber 12 to a desired base pressure.

The chamber 12 also has means 28 for introducing a gas or a mixture of gases into the chamber interior. The gas supply means 28 may comprise any suitable means known in the art such as a gas distribution ring or one or more conduits opening into the chamber interior. The gas supply means 28 may be connected through a suitable ducting and valve arrangement to one or more gas sources such as one or more gas containers not shown. If a plurality of gas conduits are used in lieu of a gas distribution ring, each gas conduit can be connected to an individual gas source. Any suitable valve arrangement sufficient to permit regulation of the mass and/or volume flow rate of each gas flowing into the chamber interior may be provided as part of the gas supply means. If desired, a pressure indicating device not shown such as a manometer may be used to indicate the pressure level inside the chamber.

If desired, the chamber 12 may also be provided with means 29 for heating the interior and/or means 30 for cooling the interior. The heating means 29 may comprise any suitable means known in the art such as a resistance coil. The cooling means 30 may also comprise any suitable means known in the art such as a water cooling loop. If needed, means not shown for independently heating the substrate material to be coated and/or either electrode 16 and 18 may also be provided.

In performing the process of the present invention, the substrate material 14 to be coated can be placed in one of a plurality of positions. For example, it may be grounded to the anode, grounded to the cathode or placed in the plasma in an ungrounded condition. In a preferred technique for performing the process of the instant invention, the substrate 14 is placed ungrounded between the electrodes 16 and 18. Any suitable means known in the art may be used to position the substrate 14 in the desired location. Prior to being placed in the chamber 12, the substrate material may be cleaned using any suitable cleaning treatment known in the art. Of course, the type of cleaning treatment used will depend upon the nature of the material forming the substrate and the type of contaminants on the material.

The process is commenced by evacuating the chamber 12 to a desired base pressure. It has been found that evacuating the chamber to an initial pressure in the range of about $10^{-5}$ Torr to about $10^{-6}$ Torr is desirable. After the initial vacuum has been established, oxygen is introduced into the chamber through the gas supply means 28 at a flow rate in the range of about 0.5 standard cubic centimeters per minute, hereinafter sccm, to about 50 sccm, preferably from about 5 sccm to about 10 sccm. The oxygen gas is introduced into the chamber interior at a desired working pressure level which is not so low that there is a loss of discharge and not so high that electrical instability and arcing occur. It is desirable to have the pressure in the range of about 5 millitorr to about 100 millitorr, preferably from about 10 millitorr to about 50 millitorr. After the oxygen gas has been introduced into the chamber 12, electrical power and current are supplied to the electrodes 16 and 18 by the external power source 20. Since the power level needed to achieve the desired deposition characteristics appears to be dependent upon the geometry of the deposition equipment, it appears to be meaningful to describe the power in terms of power per electrode area (watts/in$^2$) and/or power per contained plasma volume (watts/in$^3$). The process of the present invention may be carried out using a level of power per electrode area in the range of about 1.00 watt/in$^2$ to about 14.8 watts/in$^2$ and/or a level of power per contained plasma volume in the range of about 0.17 watts/in$^3$ to about 2.65 watts/in$^3$. Preferably, the level of power per electrode area is in the range of about 4.9 watts/in$^2$ to about 10 watts/in$^2$ and/or the level of power per contained plasma volume in the range of about 0.88 watts/in$^3$ to about 1.75 watts/in$^3$. The current to the electrodes 16 and 18 is preferably supplied at a frequency in the range of 10 kilohertz to about 20 gigahertz. Most preferably, the current frequency is within the range of radio frequencies and is from about 1 megahertz to about 100 megahertz. A frequency of about 13.56 MHz has been found to be particularly useful. The power being supplied to the electrodes 16 and 18 and the gas introduced into the chamber 12 create a plasma in the chamber 12.

The substrate 14 is exposed to the plasma of oxygen for a desired time period. It has been found to be desirable to expose the substrate during this first step to the oxygen plasma for a time period in the range of at least about 5 minutes to about 40 minutes, preferably from about 10 minutes to about 20 minutes. It is believed that during this oxygen pretreatment step, each surface of the substrate 14 that is to be coated is being cleaned. For example, where the substrate 14 comprises copper foil, residual hydrocarbons, greasy materials and/or other contaminants are believed to be removed from the exposed surface or surfaces of the copper foil. While the substrate material is generally cleaned prior to being placed in the chamber 12, this pretreatment step is believed to remove some, if not all, residual contaminants. There is also believed to be during this step some oxide formation on the exposed surface or surfaces. However, these oxides are not believed to be detrimental to the process as a whole.

After the substrate 14 has been exposed to the plasma for the desired time period, the power is turned off, the oxygen flow is stopped and the chamber 12 is evacuated back to the desired base pressure. After the chamber has stabilized at the base pressure for a desired period of time, a second gas is introduced through the gas supply means 28 into the chamber 12. The second gas is introduced at about the same flow rate and under the same working pressure conditions as the oxygen in the pretreatment step. The second gas may comprise any suitable monomer for producing a desired polymeric film. When copper foil is being treated, it has been found to be useful to introduce a hydrocarbon monomer into the chamber 12. For example, the second gas may be either methane, propene, or butadiene. After the second gas has been introduced into the chamber under the desired pressure conditions, the power is turned on as in the first step and a plasma is again created. It has been found desirable to expose the substrate 14 to the monomer gas plasma for a time period in the range of about 0.5 minutes to about 10 minutes, most preferably from about 2.5 minutes to about 5 minutes. During this step, the polymer film is deposited on the surface or surfaces of the substrate 14 to be coated. Generally, a relatively pinhole-free polymer film having a thickness of about 100 Å to about 1000 Å will be deposited on the exposed surface or surfaces. Where a hydrocarbon monomer is used as the second gas, the polymer film composition should be a hydrocarbon species. Here again, after the substrate has been exposed to the plasma for the desired time period, the power and gas flow are shut off and the chamber 12 is evacuated back to the base pressure.

After the chamber 12 has been stabilized at the base pressure for a desired time period, oxygen is readmitted into the chamber 12 at the same flow rate and under the same working pressure condition as the previous steps. The power is again turned on and the substrate is exposed to a second oxygen plasma. Here again, it has been found to be desirable to expose the substrate with the polymeric film coating to the plasma for a time period in the range of about 5 minutes to about 40 minutes, preferably from about 10 minutes to about 20 minutes. During this post-treatment step, it is believe that the polymeric film is made more amenable to later bonding by the opening of the bonds in the species forming the polymeric film and/or by the incorporation of oxygen into the bonds. For example, where the polymer film is a hydrocarbon species, it is believed that the post-treatment step takes away some of the hydrogen atoms and opens up some of the bonds in the hydrocarbon link. After the third step has been completed, the substrate material 14 with is polymer film coating can be removed from the chamber 12.

After the polymer film coating has been plasma deposited onto the surface or surfaces of the substrate material, the coated substrate material may be laminated to a metallic or non-metallic material not shown. For example, the coated substrate may be laminated to a fiberglass/epoxy hardboard or a flexible plastic material such as a polyimide. Any conventional laminating process known in the art, including those that use adhesives, may be used to bond the coated substrate to the metallic or non-metallic material.

To demonstrate the process of the present invention, the following tests were performed.

EXAMPLE I

Figure 2:
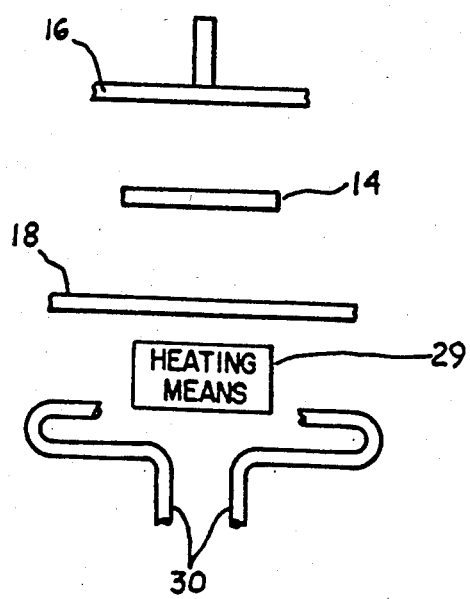
FIG. 2 is an exploded view of a portion of the apparatus of FIG. 1.

Samples of wrought copper alloy C11000 foil were first cleaned and then placed in a vacuum chamber similar to the one shown in FIGS. 1 and 2. After each sample was placed in the vacuum chamber, the chamber was evacuated to a background pressure of $10^{-5}$ Torr. Thereafter, oxygen was introduced into the chamber at a flow rate of about 5 sccm and at a working pressure of about 10 millitorr. A power level of about 4.94 watts/in$^2$ and about 0.88 watts/in$^3$ was applied to the electrodes in the chamber and a plasma was created. The current frequency was at about 13.56 MHz. The samples were exposed to this plasma for time periods ranging from about 5 minutes to about 20 minutes.

After the samples were exposed to the oxygen plasma, the chamber was evacuated and stabilized back to the base pressure. Following this, butadiene was introduced into the chamber at the same flow rate and at the same working pressure. The same power level and current frequency were applied and a butadiene plasma was created. The copper foil samples were exposed to the butadiene plasma for time periods ranging from about 2.5 minutes to about 15 minutes.

Thereafter, the chamber was evacuated and again stabilized back to the base pressure. Oxygen at the same flow rate and at the same working pressure as in the other steps was readmitted into the chamber. Power at the same level and current at the same frequency were applied to the electrodes to create an oxygen plasma. During this step, the samples were exposed to the oxygen plasma for time periods ranging from about 5 minutes to about 40 minutes.

Each copper sample treated by this procedure was then laminated to FR-4 epoxy preimpregnated fiberglass cloth using the lamination process recommended by the manufacturer for the manufacture of rigid epoxy printed circuit boards. After lamination, the degree of adhesion or peel strength was measured by using a peel test in accordance with appropriate IPC standards. As shown in Table I, the treated copper samples exhibited peel strength in the range of about 4 to about 8.5 lbs/in width.

As a point of comparison, untreated wrought copper alloy C11000 foil samples were also laminated to FR-4 epoxy preimpregnated fiberglass cloth and subjected to the same peel test. The untreated wrought copper foils were found to have a peel strength in the order of about 3 to about 4 lbs/in width.

TABLE I

| Operational Parameters - | | Power 100 watts Gas flow 5 sccm Pressure 10 mtorr | |
|---|---|---|---|
| Deposition Times (minutes) | | | |
| | Initial O$_2$ | C$_4$H$_6$ Deposition | Post-Treatment O$_2$ | Peel Strength (lb/in width) |
| (a) | 10 | 5 | 20 | 6.0–8.5 |
| (b) | 5 | 5 | 20 | 5.0 |
| (c) | 20 | 5 | 20 | 7.5–8.0 |
| (d) | 10 | 2.5 | 20 | 6.0 |
| (e) | 10 | 10 | 20 | 4.0 |
| (f) | 10 | 15 | 20 | 4.0 |
| (g) | 10 | 5 | 10 | 7.5–8.0 |
| (h) | 10 | 5 | 5 | 5.0 |
| (i) | 10 | 5 | 40 | 5.0 |

EXAMPLE II

To further demonstrate the present invention, samples of copper alloy C11000 foil were subjected as in Example I to an oxygen plasma preteatment, a butadiene plasma deposition treatment, and an oxygen plasma post-treatment. The oxygen pretreatment was applied for time periods in the range of about 7 minutes to about 10 minutes, the butadiene plasma deposition treatment was applied for time periods in the range of about 3.5 to about 5 minutes and the oxygen post-treatment was applied for time periods in the range of about 14 minutes to about 20 minutes. The gas flow rate and the pressure conditions in each step were the same as in Example I. The power level during each step did differ from Example I in that it was about 7.4 watts/in$^2$ and about 1.33 watts/in$^3$.

As in Example I, the treated samples were laminated to FR-4 epoxy preimpregnated fiberglass cloth and subjected to a peel test. As can be seen from Table II, the samples exposed to the butadiene plasma deposition treatment for a time period of about 3.5 minutes exhibited a peel strength in the range of about 5 to about 6.5 lbs./inch width whereas the sample exposed to the butadiene deposition for 5 minutes only exhibited a peel strength of about 1 lb./inch width. While it is not clear why the latter sample exhibited a significant loss of peel strength, the data does suggest that increased power shortens the allowable period for the polymer film deposition step.

TABLE II

| Operational Conditions - | | Power 150 watts Gas flow 5 sccm Pressure 10 mtorr | |
|---|---|---|---|
| | O$_2$ Pretreat (minutes) | C$_4$H$_6$ Deposition (minutes) | O$_2$ Post-Treatment (minutes) | Peel Strength (lb/in width) |
| (a) | 10 | 3.5 | 14 | 6.5 |
| (b) | 7 | 3.5 | 20 | 5.0 |
| (c) | 7 | 5.0 | 14 | 1.0 |

While the present invention has been described in terms of a particular plasma deposition equipment, it should be generally applicable to a wide range of such equipment. It is believed, however, that the operational ranges described above for the various processing variables may be strongly dependent upon the specific geometry of the deposition equipment. Therefore, with a change in equipment, results similar to those described hereinbefore may be obtained outside the aforementioned processing limits.

While particular hydrocarbon monomers have been described to deposit a polymer film, it is believed that similar results would be obtained with virtually any straight chain hydrocarbon, independent of the C to C bond structure, i.e. single, double or triple bonds, or chain length.

While the invention has been illustrated in the context of applying a hydrocarbon polymer film to a copper substrate, it is believed that similar polymeric films for improving laminate adhesion could be deposited on substrates formed from copper alloys, other metals and metal alloys and non-metallic materials such as silica using the process of the present invention.

While the invention has been described in terms of a batchwise technique, the process may also be used in a continuous or semi-continuous operation. If desired, each step of the three-step process of the present invention could be performed in a separate vacuum chamber. The only limitation to continuous and/or semi-continuous operations would be not to expose the substrate to be coated to the atmosphere between the various steps of the process. It should be recognized that by performing each step in a separate chamber, it may not be necessary to evacuate each chamber back to the base pressure before subjecting the substrate to the next step of the process.

Depending upon the position of the substrate relative to the electrodes, the polymeric film coating may be deposited on either one surface or a plurality of surfaces of the substrate. If it is desired to deposit the polymeric coating on only one side while the substrate is in an ungrounded condition, two substrates can be placed adjacent one another so that the adjacent substrate faces are not coated.

The patents and article set forth in this specification are intended to be incorporated by reference herein.

It is apparent that there has been provided in accordance with this invention a three-step plasma treatment of copper foils to enhance their laminate adhesion which fully satisfies the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. A composite article comprising:
   a copper or copper alloy foil having a plasma deposited polymeric film on at least one surface; and
   a layer of plastic material bonded to said at least one foil surface on which said polymeric film is deposited.

2. The article of claim 1 further comprising said plastic material layer being formed from a fiberglass epoxy material.

3. The article of claim 1 further comprising said plastic material layer being formed from a polyimide material.

4. The article of claim 1 further comprising said film having a thickness in the range of about 100 Å to about 1000 Å.

5. The article of claim 1 wherein said article comprises a printed circuit board.

6. The article of claim 1 wherein said article comprises a flexible circuit.

7. The article of claim 1 further comprising:
   said polymeric film coated foil exhibiting a peel strength of at least about 4 lbs/in width.

8. The article of claim 7 further comprising:
   said polymeric film coated foil exhibiting a peel strength in the range of about 4 lbs/in to about 8.5 lbs/in width.

9. A composite article comprising:
   a metal or metal alloy substrate material having a plasma deposited polymeric film on at least one surface, said film being formed by the process of
   (a) forming a first plasma of predominantly oxygen gas in the vicinity of said substrate material;
   (b) exposing said substrate material to said first plasma for a first period of time;
   (c) forming a plasma of a hydrocarbon monomer gas in the vicinity of said substrate material;
   (d) exposing said substrate material to said hydrocarbon monomer gas plasma for a second period of time;
   (e) forming a second plasma of predominantly oxygen gas in the vicinity of said substrate material; and
   (f) exposing said substrate material to said second oxygen plasma for a third period of time; and
   a layer of plastic material bonded to said at least one surface.

10. The article of claim 9 further comprising:
    said substrate material being formed from copper or a copper base alloy.

* * * * *